(12) United States Patent
Alford et al.

(10) Patent No.: US 7,541,261 B2
(45) Date of Patent: Jun. 2, 2009

(54) FLEXIBLE ELECTRONICS USING ION IMPLANTATION TO ADHERE POLYMER SUBSTRATE TO SINGLE CRYSTAL SILICON SUBSTRATE

(75) Inventors: Terry L. Alford, Phoenix, AZ (US); Douglas C. Thompson, Jr., Chandler, AZ (US); Hyunchul Kim, Chandler, AZ (US); Michael A. Nastasi, Santa Fe, NM (US); James W. Mayer, Phoenix, AZ (US); Daniel Adams, Durbanville (ZA)

(73) Assignee: Arizona Board of Regents, Tempe, AZ (US)

( * ) Notice: Subject to any disclaimer, the term of this patent is extended or adjusted under 35 U.S.C. 154(b) by 237 days.

(21) Appl. No.: 10/579,051

(22) PCT Filed: Nov. 17, 2004

(86) PCT No.: PCT/US2004/038702

§ 371 (c)(1),
(2), (4) Date: May 9, 2006

(87) PCT Pub. No.: WO2005/055281

PCT Pub. Date: Jun. 16, 2005

(65) Prior Publication Data

US 2007/0085953 A1    Apr. 19, 2007

Related U.S. Application Data

(60) Provisional application No. 60/523,022, filed on Nov. 17, 2003, provisional application No. 60/524,009, filed on Nov. 21, 2003, provisional application No. 60/524,010, filed on Nov. 21, 2003.

(51) Int. Cl.
*H01L 21/30* (2006.01)
*H01L 21/46* (2006.01)

(52) U.S. Cl. ............... 438/455; 438/406; 257/E21.567
(58) Field of Classification Search ............... 438/406, 438/455; 257/E21.567
See application file for complete search history.

(56) References Cited

U.S. PATENT DOCUMENTS 6,858,480 B2    2/2005    Nakamura et al.

(Continued)

OTHER PUBLICATIONS

Hochbauer et al., "Physical mechanisms behind the ion-cut in hydrogen implanted silicon", J. Appl. Phys., 92(5):2335-2342, 2002.

(Continued)

*Primary Examiner*—Charles D. Garber
*Assistant Examiner*—Stanetta D Isaac
(74) *Attorney, Agent, or Firm*—McDonnell Boehnen Hulbert & Berghoff LLP

(57) ABSTRACT

An electronic apparatus uses a single crystalline silicon substrate disposed adjacent to a flexible substrate. The electronic apparatus may be a flexible flat panel display, or a flexible printed circuit board. The flexible substrate can be made from polymer, plastic, paper, flexible glass, and stainless steel. The flexible substrate is bonded to the single crystalline substrate using an ion implantation process. The ion implantation process involves the use of a noble gas such as hydrogen, helium, xenon, and krypton. A plurality of semiconductor devices are formed on the single crystalline silicon substrate. The semiconductor devices may be thin film transistors for the flat panel display, or active and passive components for the electronic device.

8 Claims, 2 Drawing Sheets

U.S. PATENT DOCUMENTS 7,176,108 B2 *   2/2007   Cayrefourcq et al. ....... 438/458
2003/0013280 A1   1/2003   Yamanaka

OTHER PUBLICATIONS

Hochbauer et al., "Investigation of the cut location in hydrogen implantation induced silicon surface layer exfoliation", J. Appl. Phys., 89(11):5980-5990, 2001.

Hochbauer et al., "Hydrogen blister in boron and hydrogen coimplanted n-type silicon", Appl. Phys. Lett., 75(25):3938-3940, 1999.

* cited by examiner

FLEXIBLE ELECTRONICS USING ION IMPLANTATION TO ADHERE POLYMER SUBSTRATE TO SINGLE CRYSTAL SILICON SUBSTRATE

CLAIM TO DOMESTIC PRIORITY

This application is a U.S. National Stage Application filed under 35 U.S.C. 371 claiming priority from the International Application No. PCT/US2004/038702, filed Nov. 17, 2004, which claims the benefit of U.S. provisional application No. 60/523,022, filed Nov. 17, 2003, provisional application No. 60/524,009, filed Nov. 21, 2003, and provisional application No. 60/524,010, filed Nov. 21, 2003, and which applications are incorporated herein by reference.

STATEMENT REGARDING FEDERALLY-SPONSORED RESEARCH OR DEVELOPMENT

The U.S. Government has a paid-up license in the present invention and the right in limited circumstances to require the patent owner to license others on fair and reasonable terms as provided by the terms of Department of Defense Contract No. DMR-0308127.

FIELD OF THE INVENTION

The present invention relates in general to flexible electronics and, more particularly, to a flexible display or electronic device using ion implantation to bond a flexible substrate to single crystal silicon substrate.

BACKGROUND OF THE INVENTION

Flat panel displays are used in many applications to visually present data and images. Flat panel displays have a thin profile and provide high resolution for uses such as computer monitors and television screens. The liquid crystal display (LCD) is one type of flat panel display. The LCD uses a silicon on glass substrate. The active semiconductor-based pixels are formed on the silicon substrate. The glass substrate is conducive to high temperatures which are commonly used in many semiconductor manufacturing processes.

While LCDs have been around for some time and are generally preferred over CRT-type displays, such glass-based flat panel displays have disadvantages as well. The glass component is known to be heavy and brittle. LCDs are known to crack and are susceptible to damage. Moreover, glass displays are generally not useable in applications requiring flexibility for the display.

As new applications arise, the need for flexible flat panel displays continues to grow. Prior art flexible flat panel displays use thin film transistors (TFT) formed on amorphous silicon layers or polycrystalline silicon layers. Unfortunately, amorphous silicon and polycrystalline silicon TFTs exhibit low carrier mobility and high off-state current leakage, which reduces performance and increases power consumption. The resolution decreases and flickering may be observed in flat panel displays using TFTs formed on low carrier mobility polycrystalline silicon.

A similar problem is found in electronic devices using polycrystalline silicon. The lower carrier mobility associated with polycrystalline type substrates reduces the performance of the electronic device.

On the other hand, single crystalline silicon is known to have greater carrier mobility. The higher carrier mobility in the presence of an electrostatic field, as found in single crystalline silicon, provides better performance for flat panel displays and electronic devices. However, single crystalline silicon typically involves higher temperature semiconductor processes. These high temperatures are incompatible with polymer and other flexible amorphous substrates.

A need exists for a flat panel display or electronic device using single crystalline silicon on a flexible substrate.

SUMMARY OF THE INVENTION

In one embodiment, the present invention is a flat panel display, comprising a flexible substrate. A single crystalline silicon substrate is disposed adjacent to the flexible substrate. The flexible substrate is bonded to the single crystalline substrate using an ion implantation process. A plurality of semiconductor devices are formed on the single crystalline silicon substrate.

In another embodiment, the present invention is an electronic device comprising a flexible substrate. A single, crystalline silicon substrate is disposed adjacent to the flexible substrate. The flexible substrate is bonded to the single crystalline substrate using an ion implantation process. A plurality of active semiconductor devices are formed on the single crystalline silicon substrate.

In another embodiment, the present invention is an electronic apparatus comprising a flexible substrate. A single crystalline silicon substrate is disposed adjacent to the flexible substrate. The flexible substrate is bonded to the single-crystalline substrate using an ion implantation process. A plurality of semiconductor devices are formed on the single crystalline silicon substrate.

In another embodiment, the present invention is a method of forming an electronic apparatus comprising providing a flexible substrate, providing a single crystalline silicon substrate disposed adjacent to the flexible substrate, wherein the flexible substrate is bonded to the single crystalline substrate using an ion implantation process, and providing a plurality of semiconductor devices formed on the single crystalline silicon substrate.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
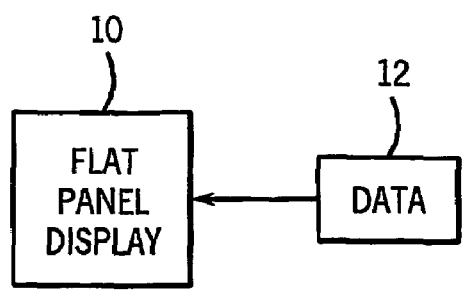
FIG. 1 illustrates a flexible panel display receiving data.

A flexible flat panel display 10, such as shown in FIG. 1, has a myriad of uses in the electronics and display markets. For example, the flexible flat panel display 10 can be used for an electronic paper. Information can be downloaded from data source 12, e.g., personal computer, wireless link, or satellite link, into the electronic paper memory for viewing on the display screen, as shown in FIG. 1. Because the flat panel display is flexible, the electronic paper can be rolled up after use and stored in a convenient location. Other commercial uses include portable military displays on clothing, displays implanted in living tissue of humans and animals, and displays that must conform to irregular or non-flat surfaces. The flexible flat panel display 10 can mold or conform to most any non-flat, organic or inorganic surface.

In another embodiment, element 10 may be a flexible electronic device. The flexible electronic device may be an integrated circuit, or a flexible print circuit board with integrated circuits mounted thereon. The flexible electronic device can be used in diagnostic equipment, small and odd-shaped enclosures, and any application requiring a flexible form factor. The flexible electronic device also has uses in military applications similar to flat panel display 10.

In the fabrication of flat panel displays and electronic devices, it is desirable to use a single crystalline silicon substrate because of its higher carrier mobility properties in the presence of an electrostatic field. A flat panel display or electronic device made with single crystalline silicon substrate provides improved performance and response time by way of higher carrier mobility and uniform threshold voltages.

Figure 2:
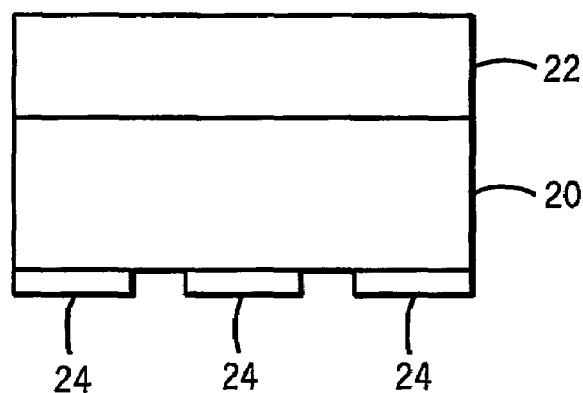
FIG. 2. illustrates a flexible substrate disposed adjacent to a single crystalline silicon substrate.

In FIG. 2, a single crystalline silicon substrate 20 is disposed on, and in contact with, flexible substrate 22. Flexible substrate 22 may be made with a flexible material such as polymer, paper, plastic, flexible glass, stainless steel, or other flexible inorganic base. Flexible substrate 22 provides a strong, yet flexible mechanical support structure for silicon substrate 20. The flexible substrate 22 is what allows the flat panel display or electronic device to bend and flex in the above mentioned applications. Semiconductor devices 24 are formed on silicon substrate 20. The semiconductor devices 24 include active and passive components necessary to perform the desired electrical function. In another embodiment, the semiconductor devices 24 may be TFTs, as well as other active and passive components, in flexible flat panel display or flexible electronic device 10.

To be useful in flexible displays or electronic devices, single crystalline silicon substrate 20 must be strongly bonded to flexible substrate 22. An ion implantation process is used to form the strong adhesive interface or bond between silicon substrate 20 and flexible substrate 22. The ion implantation induces a mixing process at the interface to change the composition and chemical bonding state between the substrates. The mixing process makes for a strong adhesion between silicon substrate 20 and flexible substrate 22.

Figure 3:
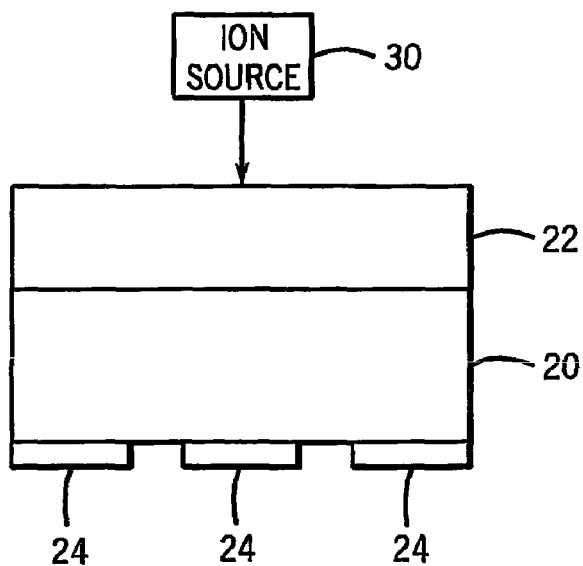
FIG. 3 illustrates an ion implantation source implanting ions through the flexible substrate to the interface between the flexible and silicon substrates.

Turning to FIG. 3, an ion implantation source 30 is positioned on the back side, oriented in the direction toward flexible substrate 22. The implantation source 30 may use hydrogen, helium, xenon, krypton, or other inert, noble gases as its source of ions. Once the flexible substrate 22 is disposed adjacent to, and in contact with, silicon substrate 20, the implantation source 30 radiates on ion beam, e.g., $H^+$ or $He^+$, through flexible substrate 22 and into silicon substrate 20.

In one embodiment, the ion implantation penetrates deep into silicon substrate 20 to induce an-ion cut. The ion cut involves formation of $H_2$ gas bubbles in high internal pressure which causes a cleavage within the silicon. The ion cut facilitates separation of a thin slice of the silicon substrate.

The penetration depth of the ion beam is a function of beam particle energy. By adjusting the ion beam energy level, the ion implantation process can induce an energy loss at the interface between silicon substrate 20 and flexible substrate 22. The energy loss cause ions to be deposited at the substrate interface by ion mixing to induce adhesion between the materials. The single crystalline silicon substrate 20 bonds to the flexible substrate 22 in response to the ion beam having the appropriate energy level to induce the ion mixing at the interface between silicon substrate 20 and flexible substrate 22.

Figure 4:
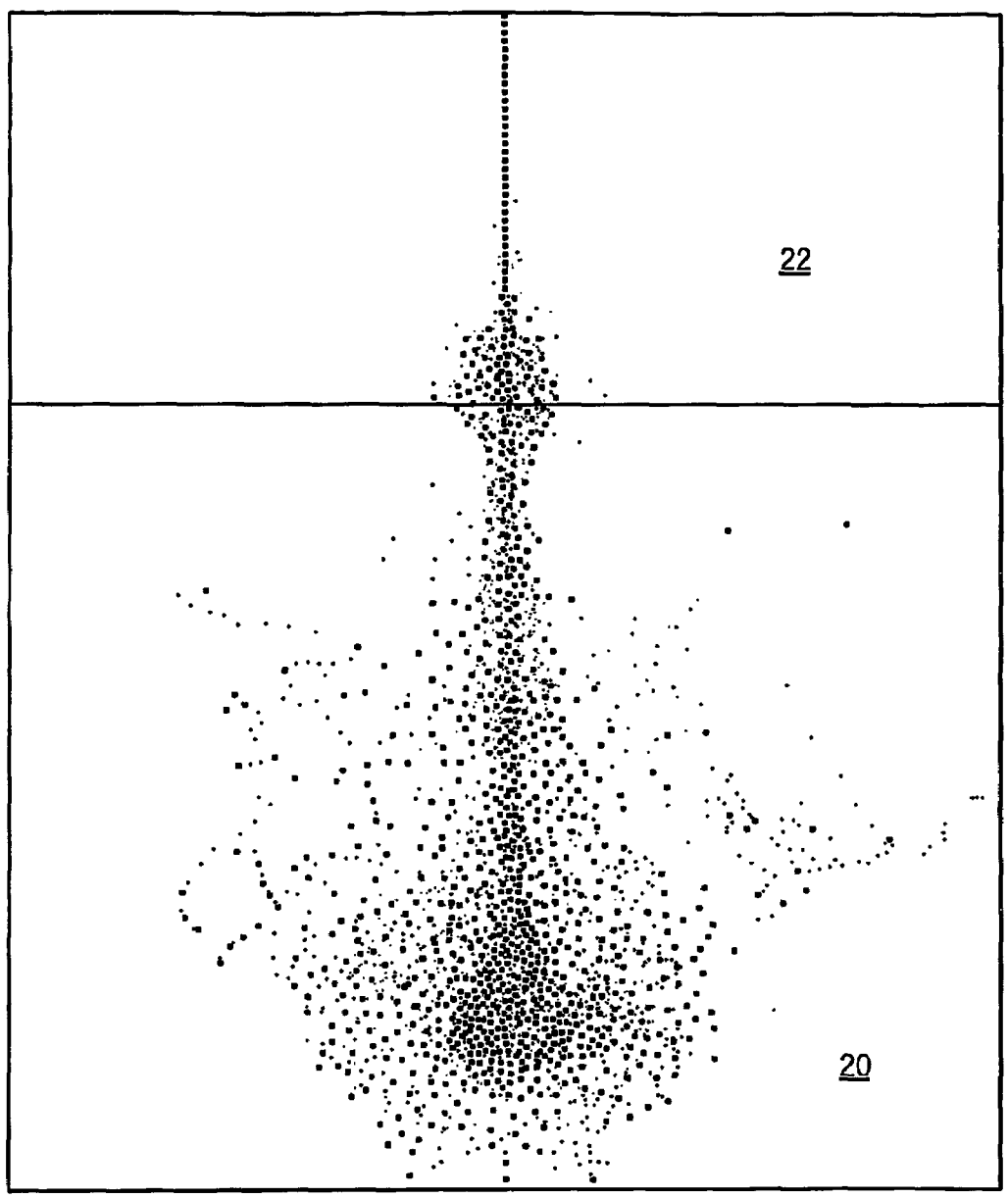
FIG. 4 illustrates ion implantation through polymer layer into silicon substrate.

In one embodiment, the ion cut process deposits ions deeper in the silicon substrate, while the ion mixing process at the silicon and flexible substrate interface is performed in different ion implantation steps. One ion beam energy level performs the ion cut, and a second ion beam energy level causes the ion mixing at the substrate interface. Alternatively, the ion implantation deeper in the silicon substrate for the ion cut operation and the ion mixing at the silicon and flexible substrate interface is performed in the same ion implantation step. FIG. 4 shows hydrogen ions being implanted through polymer substrate to the silicon substrate. The ion mixing at the boundary between flexible substrate 22 and single crystalline substrate 20 induces bonding between the two layers.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of forming an electronic apparatus, comprising:
   providing a flexible substrate;
   providing a single crystalline silicon substrate disposed adjacent to the flexible substrate, wherein the flexible substrate is bonded to the single crystalline substrate by an ion implantation process through the flexible substrate to an interface of the flexible substrate and the single crystalline silicon substrate; and
   providing a plurality of semiconductor devices formed on the single crystalline silicon substrate.

2. The method of claim 1, wherein the electronic apparatus is a flexible flat panel display.

3. The method of claim 1, wherein the electronic apparatus is a flexible printed circuit board.

4. The method of claim 1, wherein the ion implantation process uses a noble gas.

5. The method of claim 1, wherein the ion implantation process uses a gas selected from the group consisting of hydrogen, helium, xenon, and krypton.

6. The method of claim 1, wherein the flexible substrate includes a polymer material.

7. The method of claim 1, wherein the flexible substrate includes a material selected from the group consisting of polymer, plastic, paper, flexible glass, and stainless steel.

8. The method of claim 1, wherein the plurality of semiconductor devices includes thin film transistors.

* * * * *